(12) United States Patent
Oh et al.

(10) Patent No.: US 11,189,784 B2
(45) Date of Patent: Nov. 30, 2021

(54) METHOD FOR FORMING MAGNETIC FILM AND METHOD FOR MANUFACTURING MAGNETIC STORAGE ELEMENT

(71) Applicant: ULVAC, INC., Chigasaki (JP)

(72) Inventors: Seungjun Oh, Chigasaki (JP); Tadashi Morita, Chigasaki (JP); Tatsuhiro Nozue, Chigasaki (JP)

(73) Assignee: ULVAC, INC., Chigasaki (JP)

( * ) Notice: Subject to any disclaimer, the term of this patent is extended or adjusted under 35 U.S.C. 154(b) by 0 days.

(21) Appl. No.: 16/490,520

(22) PCT Filed: Feb. 14, 2019

(86) PCT No.: PCT/JP2019/005372
§ 371 (c)(1),
(2) Date: Aug. 30, 2019

(87) PCT Pub. No.: WO2019/163641
PCT Pub. Date: Aug. 29, 2019

(65) Prior Publication Data
US 2020/0381616 A1 Dec. 3, 2020

(30) Foreign Application Priority Data

Feb. 22, 2018 (JP) .............................. JP2018-029774

(51) Int. Cl.
*H01L 43/12* (2006.01)
*C23C 14/18* (2006.01)
(Continued)

(52) U.S. Cl.
CPC .............. *H01L 43/12* (2013.01); *C23C 14/18* (2013.01); *C23C 14/34* (2013.01); *C23C 14/5806* (2013.01); *H01L 43/10* (2013.01)

(58) Field of Classification Search
CPC ......... H01L 43/10; H01F 1/404; H01F 1/405; H01F 41/183; H01F 41/18; C23C 14/5806; C23C 14/34
See application file for complete search history.

(56) References Cited

U.S. PATENT DOCUMENTS

| 6,375,761 | B1 * | 4/2002 | Gambino | ................. | G11B 5/00 148/113 |
| 10,170,696 | B1 * | 1/2019 | Jeong | ................. | H01F 10/1936 |

(Continued)

FOREIGN PATENT DOCUMENTS

| JP | 2010140586 A | 6/2010 |
| JP | 2017084854 A | 5/2017 |

(Continued)

OTHER PUBLICATIONS

Shima et al. "Preparation and Magnetic Properties of MnxY (Y=Ga, Ge) Epitaxial Magnetic Thin Films", Spring Meeting (2015) of the Japan Institute of Metals, The Japan Institute of Metals, Mar. 4, 2015.

(Continued)

*Primary Examiner* — Tabassom Tadayyon Eslami
(74) *Attorney, Agent, or Firm* — Caesar Rivise, PC

(57) ABSTRACT

A method includes forming an amorphous magnetic film on a film formation subject by sputtering a target that includes any one selected from a group consisting of $Mn_3Sn$, $Mn_3Ge$, and $(Mn_{1-x}Fe_x)Ge$ as a main component and crystalizing the amorphous magnetic film by heating the amorphous magnetic film. The crystalizing includes heating the amorphous magnetic film to a temperature that is greater than or equal to 225° C. and less than or equal to 400° C.

6 Claims, 8 Drawing Sheets

(51) Int. Cl.
  *C23C 14/34*   (2006.01)
  *C23C 14/58*   (2006.01)
  *H01L 43/10*   (2006.01)

(56) References Cited

U.S. PATENT DOCUMENTS

| | | |
|---|---|---|
| 2010/0188771 A1 | 7/2010 | Okamura et al. |
| 2016/0217842 A1* | 7/2016 | Jeong .................. H01F 10/1936 |
| 2017/0178747 A1 | 6/2017 | Tokunaga et al. |
| 2018/0301177 A1* | 10/2018 | Nakatsuji ................ H01L 43/04 |
| 2019/0035849 A1* | 1/2019 | Jeong .................... G11C 11/161 |
| 2019/0378973 A1* | 12/2019 | Chen ..................... G11C 11/161 |
| 2020/0152781 A1* | 5/2020 | Manipatruni ........... H01L 29/18 |

FOREIGN PATENT DOCUMENTS

| | | |
|---|---|---|
| WO | 2016072162 A1 | 5/2016 |
| WO | 2017018391 A1 | 2/2017 |

OTHER PUBLICATIONS

Shima et al. "Preparation and Magnetic Properties of MnxY (Y=Ga, Ge) Tetragonal Pseudo-Heusler Alloys and Thin Films", Autumn Meeting (2015) of the Japan Institute of Metals, The Japan Institute of Metals, Sep. 2, 2015.
JP 2017084854 A, Abstract.
WO 2017018391 A1, US 20180301177 A1.
WO 2016072162 A1, US 20170178747 A1.
Shima et al. (Mar. 4, 2015), Abstract.
Shima et al. (Sep. 2, 2015), Abstract.

\* cited by examiner

METHOD FOR FORMING MAGNETIC FILM AND METHOD FOR MANUFACTURING MAGNETIC STORAGE ELEMENT

CROSS-REFERENCE TO RELATED APPLICATIONS

This application is a U.S. National Phase Application of PCT/JP2019/005372, filed Feb. 14, 2019, which claims priority to Japanese Patent Application No. 2018-029774, filed Feb. 22, 2018, the contents of which applications are incorporated herein by reference in their entireties for all purposes.

TECHNICAL FIELD

The present invention relates to a method for forming a magnetic film and a method for manufacturing a magnetic storage element including a magnetic layer.

BACKGROUND ART

An example of a known magnetic storage element is a magnetic tunnel junction element that includes a magnetic layer formed of a ferromagnetic material. The magnetic tunnel junction element stores data in accordance with magnetization directions of the magnetic layer. Since the magnetic layer is formed of a ferromagnetic material in the magnetic tunnel junction element, a leakage magnetic field generated in the magnetic tunnel junction element is increased. This hinders magnetic tunnel junction elements from being highly integrated. In this regard, there is a magnetic storage element that includes a layer formed of an antiferromagnetic material such as manganese, compd. with tin (3:1) ($Mn_3Sn$) (for example, refer to patent document 1).

Patent Document 1: International Patent Publication No. 2017/018391

SUMMARY

The thickness of a magnetic layer such as that described above needs to be approximately between several tens of nanometers and several hundred nanometers. However, a method for forming a magnetic layer having such a thickness has not yet been established. Such an issue is not limited to a case in which a magnetic layer is formed of $Mn_3Sn$ and is common to a case in which a thin film is formed of an antiferromagnetic material such as germanium-manganese (1/3) ($Mn_3Ge$) or manganese iron germanium (($Mn_{1-x}Fe_x$)Ge).

It is an object of the present invention to provide a method for forming a magnetic film and a method for manufacturing a magnetic storage element that allow a thin film to be formed of an antiferromagnetic material.

An embodiment of a method for forming a magnetic film includes forming an amorphous magnetic film on a film formation subject by sputtering a target that includes any one selected from a group consisting of $Mn_3Sn$, $Mn_3Ge$, and ($Mn_{1-x}Fe_x$)Ge as a main component and crystalizing the amorphous magnetic film by heating the amorphous magnetic film. The crystalizing includes heating the amorphous magnetic film to a temperature that is greater than or equal to 225° C. and less than or equal to 400° C.

An embodiment of a method for manufacturing a magnetic storage element includes forming a base layer on a film formation subject, forming an amorphous magnetic layer that is in contact with the base layer by sputtering a target that includes any one selected from a group consisting of $Mn_3Sn$, $Mn_3Ge$, and ($Mn_{1-x}Fe_x$)Ge as a main component and crystalizing the amorphous magnetic layer by heating the amorphous magnetic layer together with the base layer. The crystalizing includes heating the amorphous magnetic layer to a temperature that is greater than or equal to 225° C. and less than or equal to 400° C.

The configuration described above allows a thin film to be formed of a crystalized antiferromagnetic material.

In the method described above, the forming an amorphous magnetic film may include forming an amorphous $Mn_3Sn$ film on the film formation subject by sputtering a target including $Mn_3Sn$ as a main component. The configuration described above allows a thin film to be formed of crystalized $Mn_3Sn$.

In the method described above, the forming an amorphous $Mn_3Sn$ film may include setting pressure of a film formation space in which the $Mn_3Sn$ film is formed to be greater than or equal to 0.9 Pa and less than or equal to 1.7 Pa. The configuration described above limits deviation of the composition of the $Mn_3Sn$ film formed on the film formation subject from the stoichiometric ratio.

In the method described above, the forming an amorphous $Mn_3Sn$ film may include setting temperature of the film formation subject to be less than or equal to 150° C. When forming an amorphous $Mn_3Sn$ film, the configuration described above limits deviation of the composition of the $Mn_3Sn$ film from the stoichiometric ratio, which is caused by evaporation of Sn receiving heat from the film formation subject.

In the method described above, the film formation subject may include a base layer including a film-formed surface and formed of any one selected from a group consisting of Ti, Ru, Al, Pt, Ag, and Au. In the above configuration, the material forming the film-formed surface is a metal having a lattice constant that slightly differs from the lattice constant of $Mn_3Sn$. This increases the degree of freedom for a subject on which the base layer is formed.

In the method described above, the forming a base layer may include forming the base layer having a thickness that is greater than or equal to 5 nm.

In the above configuration, the crystalline state of the magnetic film is more assuredly enhanced regardless of the material forming the substrate.

DESCRIPTION OF THE EMBODIMENTS

An embodiment of a method for forming a magnetic film and a method for manufacturing a magnetic storage element will now be described with reference to FIGS. 1 to 16. The configuration of the magnetic storage element, the configuration of a sputtering apparatus in which the process for forming a magnetic film is performed, the method for manufacturing a magnetic storage element including a method for forming a magnetic film, and the embodiment will be sequentially described.

Magnetic Storage Element Configuration

The configuration of a magnetic storage element will now be described with reference to FIG. 1.

Figure 1:
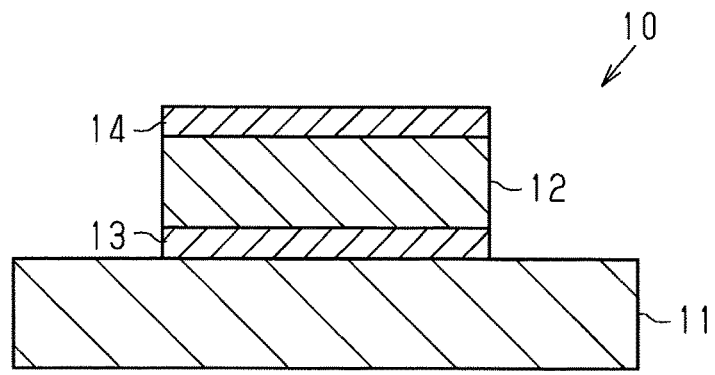
FIG. 1 is a cross-sectional view schematically illustrating the configuration of an example of a magnetic storage element formed according to an embodiment of a method for manufacturing a magnetic storage element.

As illustrated in FIG. 1, a magnetic storage element 10 includes a substrate 11 and a magnetic layer 12, which is an example of a magnetic film. The substrate 11 may have a monolayer structure or a multilayer structure. An example of the substrate 11 having a monolayer structure may be a substrate formed of magnesium oxide (MgO). An example of the substrate 11 having a multilayer structure may be a substrate including a Si layer formed of silicon (Si) and a $SiO_2$ layer formed of oxidized silicon ($SiO_2$). The $SiO_2$ layer includes a film formed surface, on which the magnetic layer 12 is formed.

The magnetic layer 12 is formed of any one selected from a group consisting of manganese, compd. with tin (3:1) ($Mn_3Sn$), germanium-manganese (1/3) ($Mn_3Ge$), and manganese iron germanium ($Mn_{1-x}Fe_x$)Ge. The magnetic layer 12 is a crystalized layer. Preferably, the magnetic layer 12 is formed of $Mn_3Sn$.

The magnetic storage element 10 may include a base layer 13 located in a position between the substrate 11 and the magnetic layer 12 but does not necessarily have to include the base layer 13. The base layer 13 is formed of any one selected from a group consisting of titanium (Ti), ruthenium (Ru), aluminum (Al), platinum (Pt), silver (Ag), and gold (Au). Preferably, when the film formed surface of the substrate 11 is formed of $SiO_2$, the magnetic storage element 10 includes the base layer 13.

The magnetic storage element 10 may further include an upper electrode layer 14. In the same manner as the base layer 13, the upper electrode layer 14 is formed of any one selected from a group consisting of Ti, Ru, Al, Pt, Ag, and Au.

Sputtering Apparatus Configuration

An example of configurations of the sputtering apparatus will now be described with reference to FIG. 2. Part of a method for manufacturing a magnetic storage element is performed in the sputtering apparatus described below.

Figure 2:
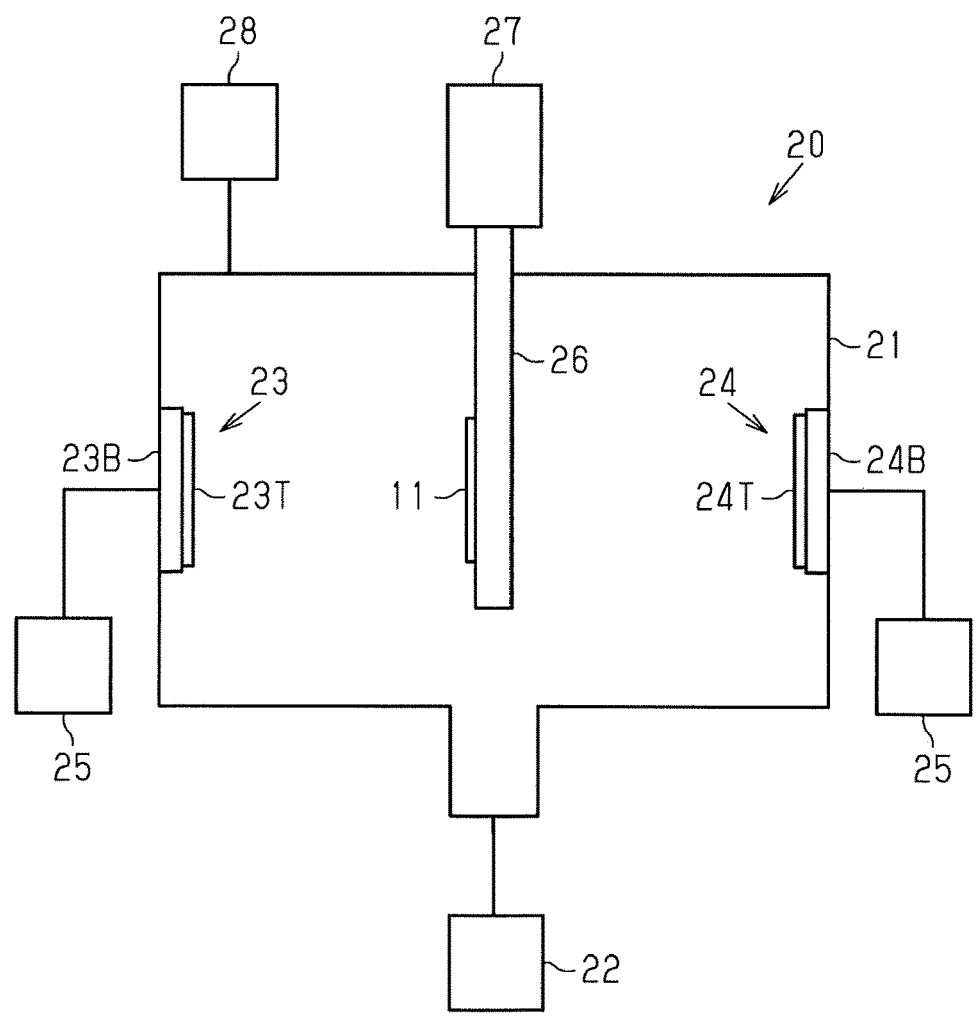
FIG. 2 is a block diagram illustrating the configuration of a sputtering apparatus in which part of the method for manufacturing a magnetic storage element is performed.

As illustrated in FIG. 2, a sputtering apparatus 20 includes a vacuum chamber 21. The vacuum chamber 21 includes space accommodating the substrate 11. The vacuum chamber 21 is connected to a gas discharge unit 22. The gas discharge unit 22 reduces the pressure of the vacuum chamber 21 to a predetermined pressure. The gas discharge unit 22 includes, for example, a vacuum pump and a valve.

The vacuum chamber 21 includes an inner surface to which a first cathode 23 and a second cathode 24 are fixed. The first cathode 23 is used to form the magnetic layer 12. The second cathode 24 is used to form at least one of the base layer 13 or the upper electrode layer 14.

The first cathode 23 includes a first target 23T and a first backing plate 23B. The first target 23T includes any one selected from a group consisting of $Mn_3Sn$, $Mn_3Ge$, and ($Mn_{1-x}Fe_x$)Ge as a main component. Each manganese compound included in the first target 23T is 95 mass percent or more. The first backing plate 23B is formed of metal. The first target 23T is fixed to the first backing plate 23B.

The second cathode 24 includes a second target 24T and a second backing plate 24B. The second target 24T includes any one selected from a group consisting of Ti, Ru, Al, Pt, Ag, and Au as a main component. Each metal included in the second target 24T is 95 mass percent or more.

The first target 23T and the second target 24T are respectively connected to direct-current power supplies 25 by the backing plates 23B and 24B to which the targets 23T and 24T are fixed.

The sputtering apparatus 20 further includes a support 26 supporting the substrate 11. The support 26 is located between the first target 23T and the second target 24T in a direction in which the first target 23T and the second target 24T are arranged. The support 26 is configured to cause the substrate 11 to face each of the first target 23T and the second target 24T. The support 26 causes the substrate 11 to face the first target 23T at a first time point and causes the substrate 11 to face the second target 24T at a second time point that differs from the first time point.

The support 26 is connected to a rotary portion 27 that rotates the support 26. The rotary portion 27 rotates the support 26 about a rotational axis. The support 26 is shaped to extend along the rotational axis. The rotational axis is orthogonal to the direction in which the first target 23T and the second target 24T are arranged. The rotary portion 27 rotates the support 26 about the rotational axis so that the substrate 11 supported by the support 26 faces the first target 23T. Also, the rotary portion 27 rotates the support 26 about the rotational axis so that the substrate 11 supported by the support 26 faces the second target 24T.

The vacuum chamber 21 is connected to a process gas supply unit 28. The process gas supply unit 28 supplies a process gas to the space included in the vacuum chamber 21. The process gas supply unit 28 is a mass flow controller connected to a tank located outside the vacuum chamber 21. The process gas includes, for example, a noble gas such as argon.

In the sputtering apparatus 20, the substrate 11 is mounted on the support 26. After the gas discharge unit 22 discharges the gas from the vacuum chamber 21, the process gas supply unit 28 supplies the process gas to the vacuum chamber 21 at a predetermined flow rate so that the vacuum chamber 21 is adjusted to a predetermined pressure. When the substrate 11 is faced to the second target 24T, the direct-current power supply 25 applies voltage to the second backing plate 24B. As a result, the surface of the second target 24T subject to sputtering is sputtered, and the base layer 13 is formed on the substrate 11. When the substrate 11 is faced to the first target 23T, the direct-current power supply 25 applies voltage to the first backing plate 23B. As a result, the surface of the first target 23T subject to sputtering is sputtered, and the magnetic layer 12 is formed on the base layer 13.

Magnetic Storage Element Manufacturing Method

A method for manufacturing the magnetic storage element 10 will now be described with reference to FIG. 3. The method for manufacturing the magnetic storage element 10 includes a method for forming the magnetic layer 12. A method for manufacturing the magnetic storage element 10 that includes the base layer 13 will be described below as an example of the method for manufacturing the magnetic storage element 10.

The method for manufacturing the magnetic storage element 10 includes forming the base layer 13 on the substrate 11, which is an example of a film formation subject, forming the amorphous magnetic layer 12, and crystalizing the amorphous magnetic layer. The forming an amorphous magnetic layer includes forming the amorphous magnetic layer 12 that is in contact with the base layer 13 by sputtering a target including any one selected from a group consisting of $Mn_3Sn$, $Mn_3Ge$, and $(Mn_{1-x}Fe_x)Ge$ as a main component. The crystalizing the amorphous magnetic layer 12 includes heating the amorphous magnetic layer 12 together with the base layer 13. In this case, the magnetic layer 12 is heated to a temperature that is greater than or equal to 225° C. and less than or equal to 400° C. The method for manufacturing the magnetic storage element 10 will now be described more specifically with reference to FIG. 3.

Figure 3:
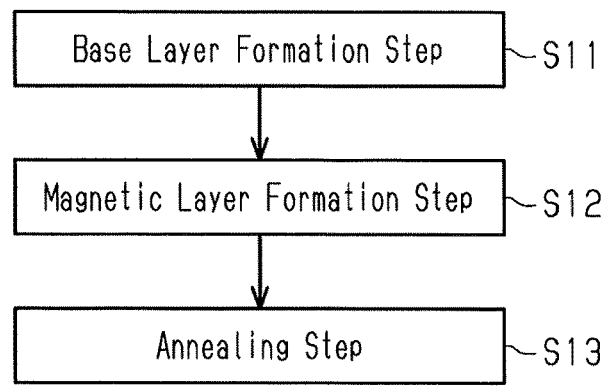
FIG. 3 is a flowchart illustrating a method for manufacturing a magnetic storage element.

As illustrated in FIG. 3, the method for manufacturing the magnetic storage element 10 includes a base layer formation step (step S11), a magnetic layer formation step (step S12), and an annealing step (step S13).

In the base layer formation step, the base layer 13 is formed on the substrate 11. In the base layer formation step, the base layer 13 is formed of any one selected from a group consisting of Ti, Ru, Al, Pt, Ag, and Au on the substrate 11. The thickness of the base layer 13 is from several nanometers to several tens of nanometers and is, preferably, greater than or equal to 5 nm.

The magnetic layer formation step and the annealing step, which follow the base layer formation step, configure a method for forming a magnetic film. An example of a film formation subject in the step of forming a magnetic film includes the substrate 11 and the base layer 13. Thus, in the method for forming a magnetic film subsequent to the base layer formation step, the film formed surface of the film formation subject includes the base layer 13 formed of any one selected from a group consisting of Ti, Ru, Al, Pt, Ag, and Au.

Hence, the base layer 13, which is an example of the film formed surface, is formed of a metal having a lattice constant that slightly differs from the lattice constant of $Mn_3Sn$. This enhances the crystalline state of the $Mn_3Sn$ film. When the base layer 13 is formed of a metal selected from the group described above, the crystalline state of the $Mn_3Sn$ layer is enhanced even when the substrate 11 includes the Si layer and the $SiO_2$ layer.

In the magnetic layer formation step, the magnetic layer 12 is formed on the base layer 13. The thickness of the magnetic layer 12 is, for example, greater than or equal to several tens of nanometers and less than or equal to several hundred nanometers. Preferably, in the magnetic layer formation step, a target including $Mn_3Sn$ as a main component is sputtered to form an amorphous $Mn_3Sn$ layer on the base layer 13. Preferably, the forming an amorphous $Mn_3Sn$ layer includes setting the pressure of a film formation space in which the $Mn_3Sn$ layer is formed to be greater than or equal to 0.9 Pa and less than or equal to 1.7 Pa. In other words, in the magnetic layer formation step, when forming the $Mn_3Sn$ layer, it is preferred that the pressure of the sputtering apparatus 20 be greater than or equal to 0.9 Pa and less than or equal to 1.7 Pa. This limits deviation of the composition of the $Mn_3Sn$ layer formed on the film formation subject from the stoichiometric ratio.

Also, in the magnetic layer formation step, when forming an amorphous $Mn_3Sn$ layer, it is preferred that the temperature of the film formation subject be less than or equal to 150° C. When forming the amorphous $Mn_3Sn$ layer, this limits deviation of the composition of the $Mn_3Sn$ layer from the stoichiometric ratio, which is caused by evaporation of Sn receiving heat from the film formation subject.

In the annealing step, the magnetic layer 12 is heated to a temperature that is greater than or equal to 230° C. and less than or equal to 400° C. As described above, the base layer 13 and the magnetic layer 12 each have a thickness that is approximately from several nanometers to several hundred nanometers. Thus, it may be assumed that the temperature of the base layer 13 and the temperature of the magnetic layer 12 are the same as the temperature of the space in which the annealing step is performed.

In the annealing step, a vacuum annealing furnace may be used to anneal the magnetic layer 12. Preferably, when annealing the magnetic layer 12, the pressure of the vacuum annealing furnace is, for example, greater than or equal to $5\times10^{-3}$ Pa and less than or equal to $5\times10^{-2}$ Pa.

Tests

Tests will now be described with reference to FIGS. 4 to 16.

Annealing Temperature

First Test

A monocrystalline substrate of magnesium oxide (MgO) having (111) orientation was prepared. The Ru layer serving as the base layer, the $Mn_3Sn$ film serving as the magnetic layer, and the Ru layer serving as the upper electrode layer were sequentially formed under the following conditions. The base layer and the upper electrode layer were formed under the same condition. The thickness of the base layer and the upper electrode layer was set to 10 nm. The thickness of the magnetic film was set to 100 nm.

Base Layer/Upper Electrode Layer

| | |
|---|---|
| Target Power | 100 W |
| Film Formation Pressure | 0.2 Pa |
| Sputter Gas | Argon (Ar) gas |
| Sputter Gas Flow Rate | 30 sccm |

Magnetic Layer

| | |
|---|---|
| Target Power | 100 W |
| Film Formation Pressure | 1.7 Pa |
| Sputter Gas | Argon gas |
| Sputter Gas Flow Rate | 45 sccm |

In the first test, the obtained magnetic layer was not annealed. This obtained the first test of a magnetic storage element. When an X-ray diffractometer (BRUKERAXS D8

Figure 4:
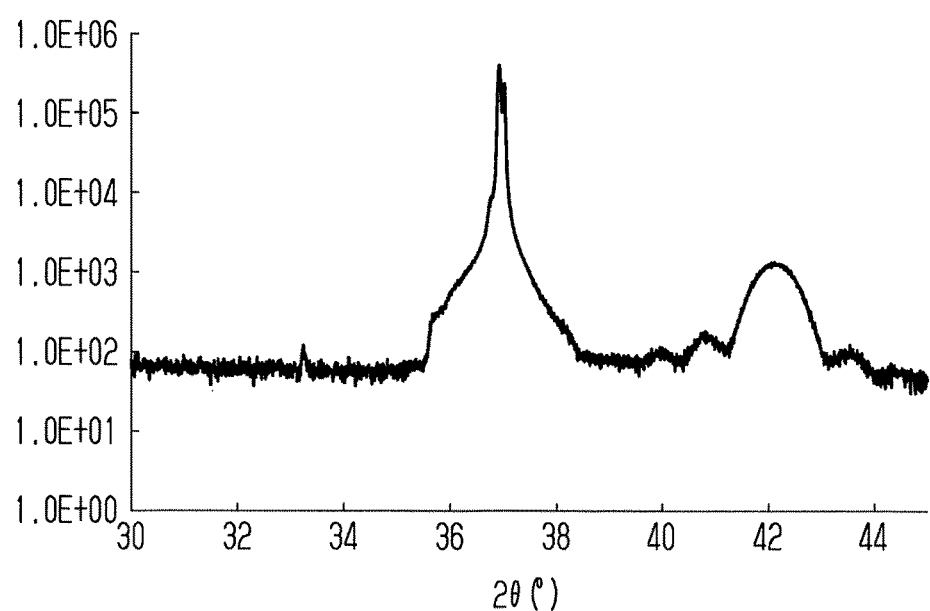
FIG. 4 is a spectrum obtained by performing X-ray diffraction on a first test of a magnetic storage element.

DISCOVER, manufactured by BRUKER) was used to analyze the magnetic storage element of the first test, the spectrum illustrated in FIG. 4 was obtained.

As illustrated in FIG. 4, a peak derived from MgO was indicated when 2θ was from 36° to 38°, and a peak derived from Ru was indicated when 2θ was from 40° to 44°. However, a peak derived from $Mn_3Sn$ was not indicated. In other words, it was indicated that when the $Mn_3Sn$ layer is not annealed, the $Mn_3Sn$ layer is in an amorphous state.

Second Test

After obtaining a multilayer body including a substrate, a base layer, a magnetic layer, and an upper electrode layer through the same method as the first test, the magnetic layer was annealed to obtain a second test of a magnetic storage element.

Annealing Conditions

| | |
|---|---|
| Pressure | $5 \times 10^{-3}$ Pa |
| Temperature | 300° C. |
| Time | 30 minutes |

Figure 5:
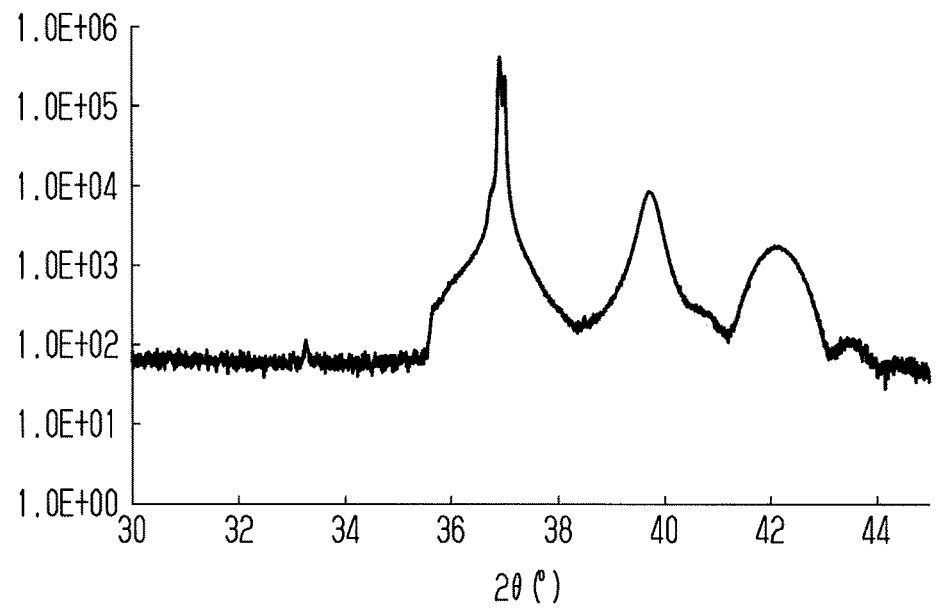
FIG. 5 is a spectrum obtained by performing X-ray diffraction on a second test of a magnetic storage element.

When the X-ray diffractometer (same as above) was used to analyze the magnetic storage element of the second test, the spectrum illustrated in FIG. 5 was obtained.

As illustrated in FIG. 5, a peak derived from MgO and a peak derived from Ru were indicated in the same manner as the first test. Additionally, a peak derived from $Mn_3Sn$ was indicated when 2θ was from 38° to 42°. Namely, it was indicated that the $Mn_3Sn$ layer of the second test was crystalized.

Third Test

A third test of a magnetic storage element was obtained in the same manner as the second test except that the substrate was changed to a multilayer substrate including a Si layer and a $SiO_2$ layer and the annealing temperature was changed to 200° C. When the X-ray diffractometer (same as above) was used to analyze the magnetic storage element of the third test, the spectrum illustrated in FIG. 6 was obtained.

Figure 6:
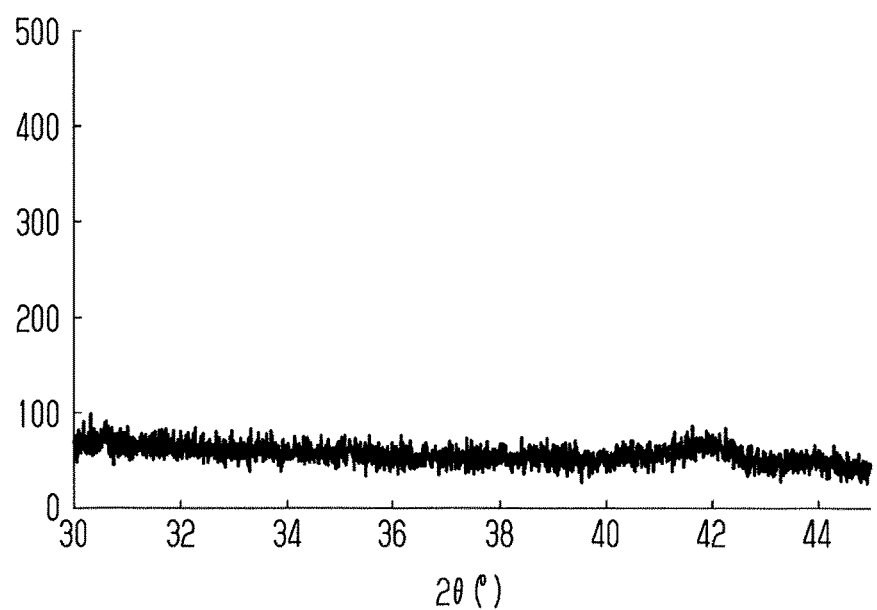
FIG. 6 is a spectrum obtained by performing X-ray diffraction on a third test of a magnetic storage element.

As illustrated in FIG. 6, none of the peaks were indicated in the spectrum obtained from the magnetic storage element of the third test. Namely, it was indicated that the $Mn_3Sn$ layer of the third test was not crystalized.

Fourth Test

A fourth test of a magnetic storage element was obtained in the same manner as the third test except that the annealing temperature was changed to 225° C. When the X-ray diffractometer (same as above) was used to analyze the magnetic storage element of the fourth test, the spectrum illustrated in FIG. 7 was obtained.

Figure 7:
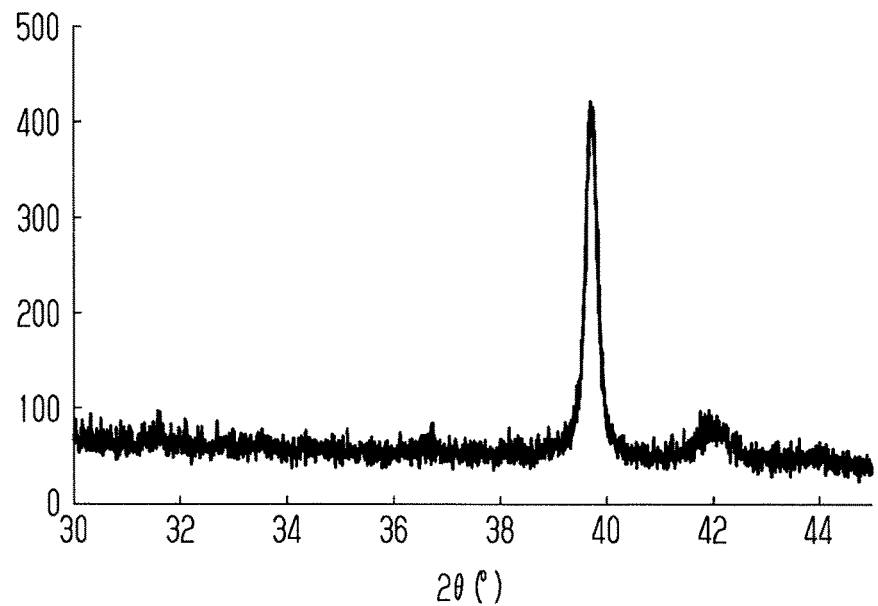
FIG. 7 is a spectrum obtained by performing X-ray diffraction on a fourth test of a magnetic storage element.

As illustrated in FIG. 7, a peak derived from $Mn_3Sn$ was indicated when 2θ was from 38° to 40°, and a peak derived from Ru was indicated when 2θ was from 40° to 44°. Namely, it was indicated that the $Mn_3Sn$ layer of the fourth test was crystalized.

Fifth Test

A fifth test of a magnetic storage element was obtained in the same manner as the third test except that the annealing temperature was changed to 450° C. When the X-ray diffractometer (same as above) was used to analyze the magnetic storage element of the fifth test, the spectrum illustrated in FIG. 8 was obtained.

Figure 8:
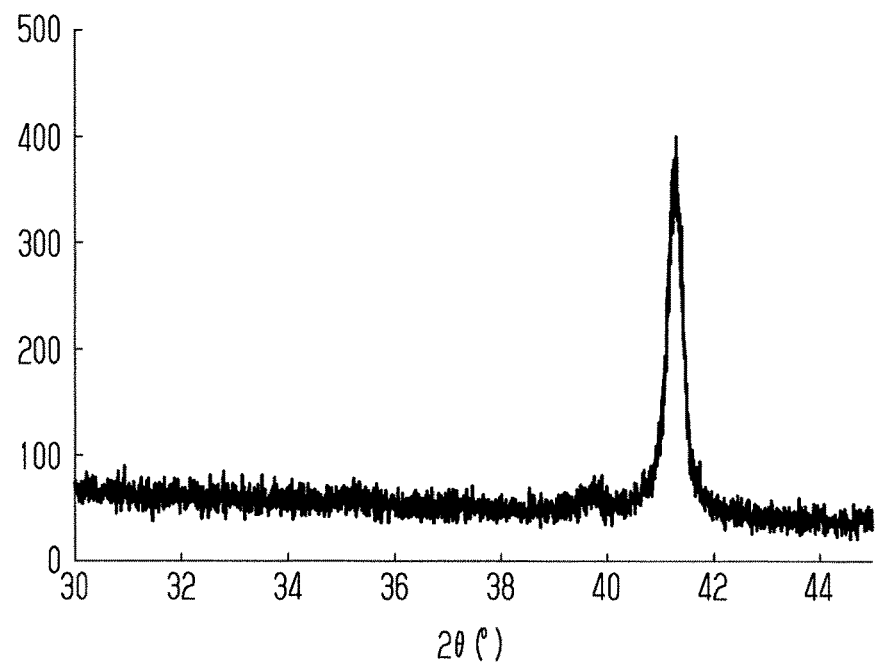
FIG. 8 is a spectrum obtained by performing X-ray diffraction on a fifth test of a magnetic storage element.

As illustrated in FIG. 8, a peak derived from $Mn_3Sn$ was barely indicated in the spectrum obtained from the magnetic storage element of the fifth test. However, a peak was indicated when 2θ was from 40° to 42°. It is assumed that this peak was derived from a compound formed by reaction of $Mn_3Sn$ and Ru.

As described above, according to the first to fifth tests, it was indicated that the annealing temperature needs to be greater than or equal to 225° C. in order to obtain a crystalized $Mn_3Sn$ layer. Additionally, it was indicated that the annealing temperature needs to be lower than 450° C. in order to inhibit reaction of the $Mn_3Sn$ layer with the base layer and the upper electrode layer, which are in contact with the $Mn_3Sn$ layer.

Film Formation Pressure

Sixth to eleventh tests of magnetic films were obtained in the same manner as the first test except that the film formation pressure was changed as follows. In the sixth test, the film formation pressure was set to 0.10 Pa. In the seventh test, the film formation pressure was set to 0.15 Pa. In the eighth test, the film formation pressure was set to 0.25 Pa. In the ninth test, the film formation pressure was set to 0.50 Pa. In the tenth test, the film formation pressure was set to 0.90 Pa. In the eleventh test, the film formation pressure was set to 1.70 Pa in the same manner as the first test. The composition of the $Mn_3Sn$ target used to form the magnetic films was analyzed using an energy dispersive X-ray analyzer (EX-220 X-Stream, HORIBA, Ltd.) installed in a scanning electron microscope. This indicated that in the $Mn_3Sn$ target, the ratio (Mn:Sn) of the number of Mn atoms and the number of Sn atoms was 3.1:1.

The composition of the magnetic film obtained in each test was analyzed using the energy dispersive X-ray analyzer (same as above). The analysis results are illustrated in table 1 below. In the following description, the atom ratio refers to a ratio in the number of atoms where the number of Sn atoms is set to one.

TABLE 1

| | Pressure (Pa) | Atom Ratio (Mn:Sn) |
|---|---|---|
| Sixth Test | 0.10 | 6.67:1 |
| Seventh Test | 0.15 | 6.61:1 |
| Eighth Test | 0.25 | 6.36:1 |
| Ninth Test | 0.50 | 5.09:1 |
| Tenth Test | 0.90 | 3.80:1 |
| Eleventh Test | 1.70 | 3.58:1 |

As illustrated in table 1, it was indicated that the atom ratio was 6.67:1 in the sixth test, the atom ratio was 6.61:1 in the seventh test, and the atom ratio was 6.36:1 in the eighth test. It was also indicated that the atom ratio was 5.09:1 in the ninth test, the atom ratio was 3.80:1 in the tenth test, and the atom ratio was 3.58:1 in the eleventh test. The same results as in table 1 were obtained when an electron probe microanalyzer was used to analyze the magnetic film obtained in each test.

Thus, it was indicated that when forming a magnetic film, deviation of the composition of the magnetic film formed on the substrate from the stoichiometric ratio is limited if the pressure of the film formation space is greater than or equal to 0.90 Pa and less than or equal to 1.70 Pa.

Substrate and Base Layer

Twelfth Test

A twelfth test of a magnetic storage element was obtained in the same manner as the second test except that the Ru layer serving as the base layer was not formed. When the X-ray diffractometer (same as above) was used to analyze the magnetic storage element of the twelfth test, the spectrum illustrated in FIG. 9 was obtained.

Figure 9:
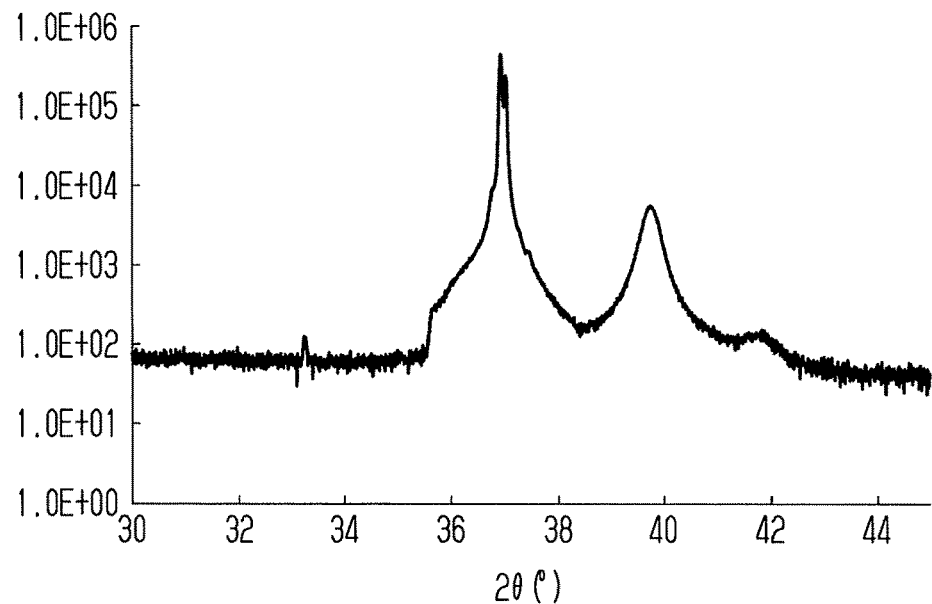
FIG. 9 is a spectrum obtained by performing X-ray diffraction on a twelfth test of a magnetic storage element.

As illustrated in FIG. 9, a peak derived from MgO was indicated when 2θ was from 36° to 38°, and a peak derived from Mn₃Sn was indicated when 2θ was from 38° to 42°. Namely, it was indicated that when a Mn₃Sn layer is formed on a monocrystalline substrate of MgO having (111) orientation, the crystalized Mn₃Sn layer is obtained even when the base layer is not present.

Thirteenth Test

A thirteenth test of a magnetic storage element was obtained in the same manner as the twelfth test except that the substrate was changed to a multilayer substrate including a Si layer and a SiO₂ layer. When the X-ray diffractometer (same as above) was used to analyze the magnetic storage element of the thirteenth test, the spectrum illustrated in FIG. 10 was obtained.

Figure 10:
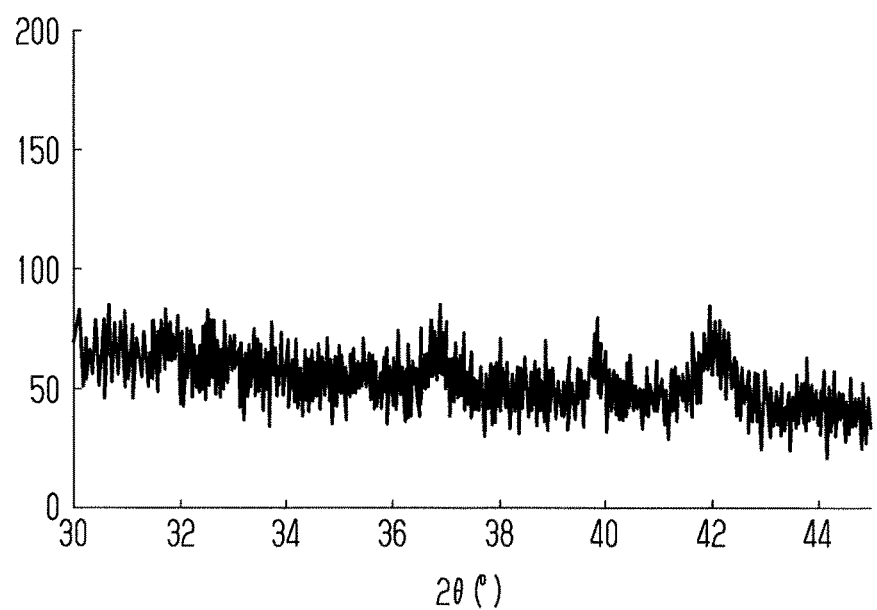
FIG. 10 is a spectrum obtained by performing X-ray diffraction on a thirteenth test of a magnetic storage element.

As illustrated in FIG. 10, a peak derived from Ru was indicated when 2θ was from 40° to 44°. Also, a peak derived from Mn₃Sn having (020) orientation was indicated when 2θ was from 36° to 38°. A peak derived from Mn₃Sn having (002) orientation was indicated when 2θ was close to 40°. However, it was indicated that the strength of these peaks was significantly smaller than the peak of Mn₃Sn indicated in the twelfth test. This indicates that a polycrystalline Mn₃Sn film was formed in the thirteenth test.

Fourteenth Test

A fourteenth test of a magnetic storage element was obtained in the same manner as the second test except that the substrate was changed to a multilayer substrate including a Si layer and a SiO₂ layer and the thickness of the base layer and the upper electrode layer was changed to 5 nm. When the X-ray diffractometer (same as above) was used to analyze the magnetic storage element of the fourteenth test, the spectrum illustrated in FIG. 11 was obtained.

Figure 11:
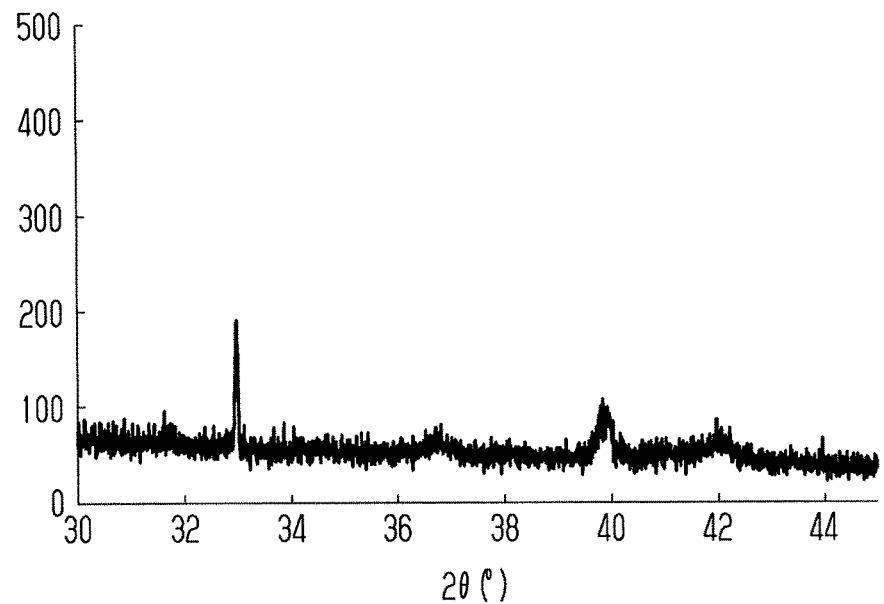
FIG. 11 is a spectrum obtained by performing X-ray diffraction on a fourteenth test of a magnetic storage element.

As illustrated in FIG. 11, a peak derived from Mn₃Sn having (002) orientation was indicated when 2θ was close to 40°. It was also indicated that the strength of the peak indicated in the fourteenth test was significantly greater than the strength of the peak indicated in the thirteenth test.

Fifteenth Test

A fifteenth test of a magnetic storage element was obtained in the same manner as the fourteenth test except that the thickness of the base layer and the upper electrode layer was changed to 10 nm. When the X-ray diffractometer (same as above) was used to analyze the magnetic storage element of the fifteenth test, the spectrum illustrated in FIG. 12 was obtained.

Figure 12:
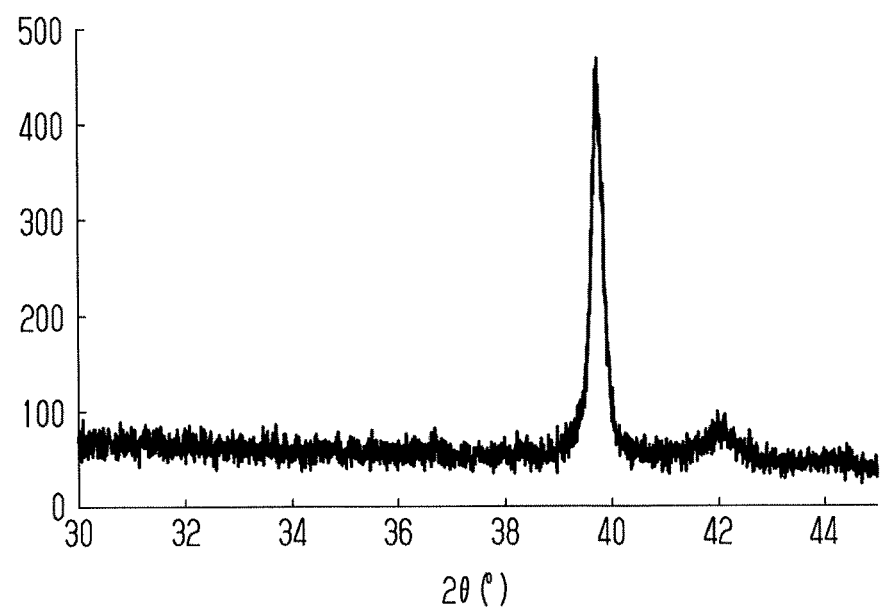
FIG. 12 is a spectrum obtained by performing X-ray diffraction on a fifteenth test of a magnetic storage element.

As illustrated in FIG. 12, a peak derived from Mn₃Sn having (002) orientation was indicated when 2θ was close to 40°. It was also indicated that the strength of the peak indicated in the fifteenth test was significantly greater than the strength of the peak indicated in the fourteenth test.

The analysis results of the thirteenth to fifteenth tests indicated that when a multilayer substrate including a Si layer and a SiO₂ layer is used, it is preferred that the thickness of the base layer be greater than or equal to 5 nm in order to obtain a monocrystalline Mn₃Sn layer having (002) orientation. It is further preferred that the thickness of the base layer be greater than or equal to 10 nm. In other words, it was indicated that when forming a monocrystalline Mn₃Sn layer, the degree of freedom for the material forming the substrate is increased when the thickness of the base layer is greater than or equal to 5 nm.

Magnetic Film Property

In sixteenth to nineteenth tests, a Hall resistance caused by an abnormal Hall effect was measured in the magnetic storage element of the thirteenth test. In each test, current flowed in a direction parallel to a surface of the magnetic film, and a magnetic field was applied in a direction orthogonal to the surface of the magnetic film. Also, the temperature of the environment in which the magnetic storage element was located was set to differ between the tests. More specifically, the temperature of the environment was set to 100 K in the sixteenth test, the temperature of the environment was set to 200 K in the seventeenth test, the temperature of the environment was set to 300 K in the eighteenth test, and the temperature of the environment was set to 400 K in the nineteenth test.

Figure 13:
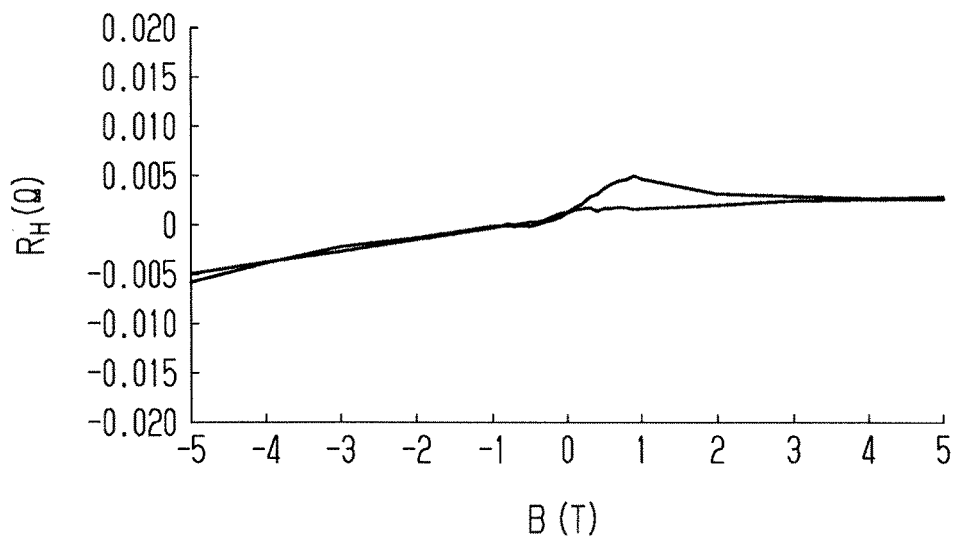
FIG. 13 is a graph illustrating the relationship between magnetic field and Hall resistance obtained in a sixteenth test.
Figure 14:
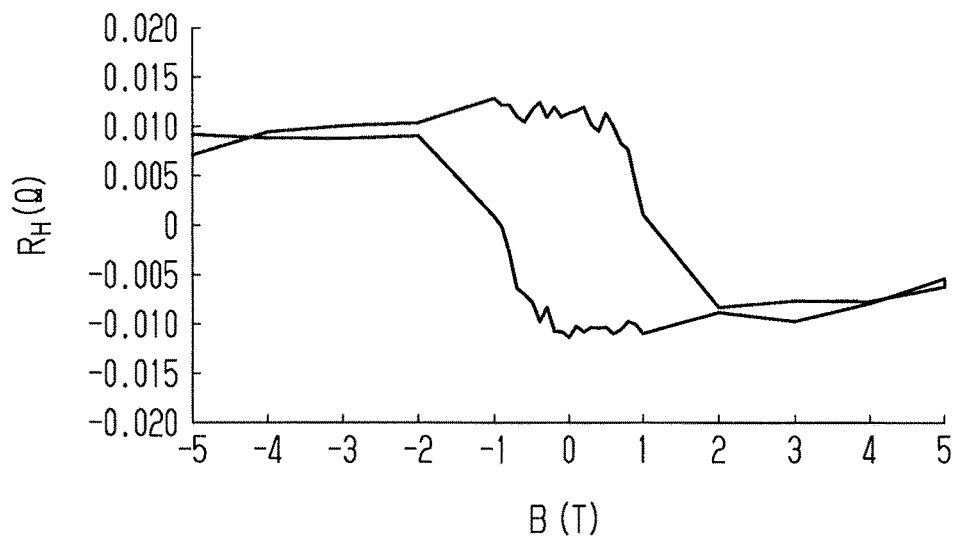
FIG. 14 is a graph illustrating the relationship between magnetic field and Hall resistance obtained in a seventeenth test.
Figure 15:
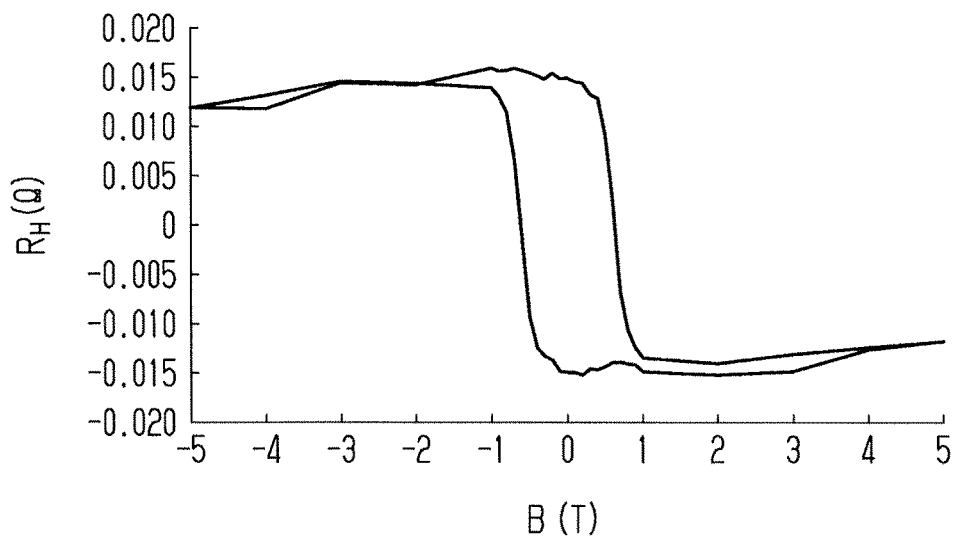
FIG. 15 is a graph illustrating the relationship between magnetic field and Hall resistance obtained in an eighteenth test.
Figure 16:
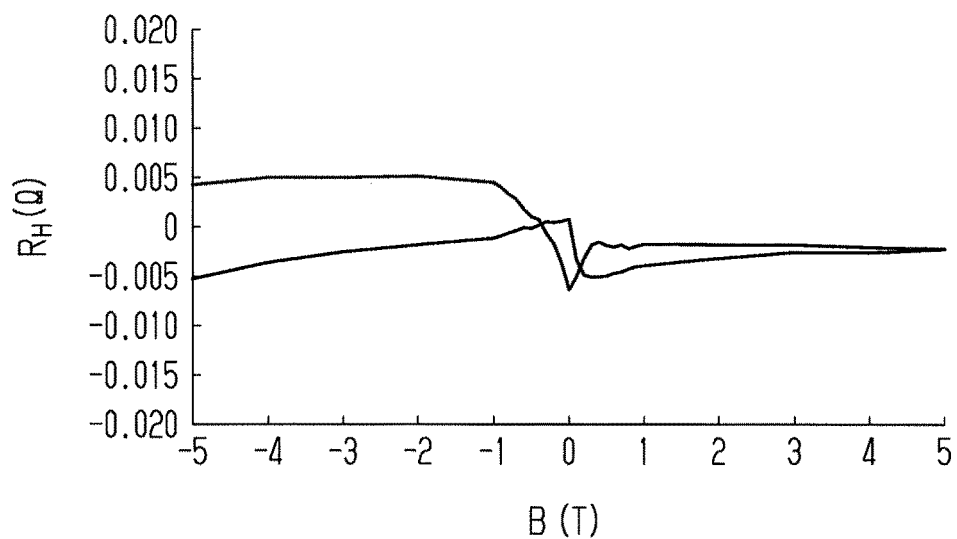
FIG. 16 is a graph illustrating the relationship between magnetic field and Hall resistance obtained in a nineteenth test.

As illustrated in FIGS. 14 and 15, it was indicated that when the temperature of the environment was 200 K or 300 K, the Hall resistance represented hysteresis corresponding to changes in the magnetic field applied to the magnetic film. In contrast, as illustrated in FIGS. 13 and 16, it was indicated that when the temperature of the environment was 100 K or 400 K, the Hall resistance did not represent hysteresis.

As described above, the method for forming the magnetic film and the method for manufacturing the magnetic storage element obtain the advantages described below.

(1) The thin film is formed of a crystalized antiferromagnetic material.

(2) The crystalized Mn₃Sn thin film is formed.

(3) When the pressure of the film formation space is greater than or equal to 0.9 Pa and less than or equal to 1.7 Pa, deviation of the composition of the Mn₃Sn film from the stoichiometric ratio is limited.

(4) When forming an amorphous Mn₃Sn layer, if the temperature of a film formation subject is set to less than or equal to 150°, deviation of the composition of the Mn₃Sn layer from the stoichiometric ratio caused by evaporation of Sn receiving heat from the substrate 11 is limited.

(5) The base layer 13 formed of any one selected from a group consisting of Ti, Ru, Al, Pt, Ag, and Au enhances the crystalline state of the Mn₃Sn layer.

(6) When the thickness of the base layer 13 is greater than or equal to 5 nm, the crystalline state of the magnetic layer 12 is more assuredly enhanced regardless of the material forming the substrate 11.

The embodiment may be modified as follows.

Base Layer

The thickness of the base layer 13 may be less than 5 nm. Even the base layer 13 having a thickness that is less than 5 nm is somewhat effective in increasing the degree of freedom for the material forming the substrate 11.

The invention claimed is:

1. A method for forming an antiferromagnetic film, the method comprising:
    forming an amorphous antiferromagnetic film on a film formation subject by sputtering a target, wherein the target includes Mn₃Sn as a main component;
    forming an upper electrode layer on the amorphous antiferromagnetic film; and
    crystalizing the amorphous antiferromagnetic film by heating the amorphous antiferromagnetic film and the upper electrode layer,
    wherein the crystalizing includes heating the amorphous antiferromagnetic film to a temperature that is greater than or equal to 225° C. and less than or equal to 400° C.

2. The method according to claim 1, wherein the forming of the amorphous antiferromagnetic film includes setting a pressure of a film formation space in which the amorphous antiferromagnetic film is formed to be greater than or equal to 0.9 Pa and less than or equal to 1.7 Pa.

3. The method according to claim 1, wherein the forming of the amorphous antiferromagnetic film includes setting a temperature of the film formation subject to be less than or equal to 150° C.

4. The method according to claim 1, wherein the film formation subject includes a base layer including a film-formed surface and formed of any one selected from a group consisting of Ti, Ru, Al, Pt, Ag, and Au.

5. A method for manufacturing a magnetic storage element, the method comprising:
   forming a base layer on a film formation subject;
   forming an amorphous antiferromagnetic layer that is in contact with the base layer by sputtering a target, wherein the target includes $Mn_3Sn$ as a main component;
   forming an upper electrode layer on the amorphous antiferromagnetic layer; and
   crystalizing the amorphous antiferromagnetic layer by heating the amorphous antiferromagnetic layer together with the base layer and the upper electrode layer,
   wherein the crystalizing includes heating the amorphous antiferromagnetic layer to a temperature that is greater than or equal to 225° C. and less than or equal to 400° C.

6. The method according to claim 5, wherein the forming a base layer includes forming the base layer having a thickness that is greater than or equal to 5 nm.

\* \* \* \* \*